United States Patent
Lin et al.

(10) Patent No.: US 10,123,418 B1
(45) Date of Patent: Nov. 6, 2018

(54) CIRCUIT BOARD STRUCTURE AND MANUFACTURING METHOD THEREOF

(71) Applicant: Unimicron Technology Corp., Taoyuan (TW)

(72) Inventors: Wei-Ti Lin, Hsinchu (TW);
Chun-Hsien Chien, Hsinchu (TW);
Fu-Yang Chen, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/903,049

(22) Filed: Feb. 23, 2018

(30) Foreign Application Priority Data

Dec. 13, 2017 (TW) .............................. 106143691 A

(51) Int. Cl.
| | |
|---|---|
| H05K 1/16 | (2006.01) |
| H05K 3/10 | (2006.01) |
| H05K 1/18 | (2006.01) |
| H05K 1/02 | (2006.01) |
| H01F 27/06 | (2006.01) |
| H05K 1/03 | (2006.01) |
| H05K 3/00 | (2006.01) |

(Continued)

(52) U.S. Cl.
CPC ............. *H05K 1/165* (2013.01); *H01F 27/06* (2013.01); *H01F 41/041* (2013.01); *H05K 1/0298* (2013.01); *H05K 1/0306* (2013.01); *H05K 1/115* (2013.01); *H05K 1/188* (2013.01); *H05K 3/0011* (2013.01); *H05K 3/10* (2013.01); *H01F 2027/065* (2013.01)

(58) Field of Classification Search
CPC ...... H05K 1/165; H05K 1/115; H05K 1/0306; H05K 3/0011; H05K 3/10; H05K 1/0298
See application file for complete search history.

(56) References Cited

U.S. PATENT DOCUMENTS

| 6,031,445 A | 2/2000 | Marty et al. |
| 9,264,013 B2 | 2/2016 | Zuo et al. |

(Continued)

FOREIGN PATENT DOCUMENTS

| JP | H07272932 | 10/1995 |
| TW | 201351457 | 12/2013 |
| TW | 201447937 | 12/2014 |

OTHER PUBLICATIONS

"Office Action of Taiwan Counterpart Application," dated May 23, 2018, p. 1-p. 11.

*Primary Examiner* — Jeremy C Norris
(74) *Attorney, Agent, or Firm* — JCIPRNET

(57) ABSTRACT

A circuit board structure including an insulating layer, first and second dielectric layers, and first and second inductors is provided. The insulating layer includes a first surface, a second surface, and a first conductive through hole. The first dielectric layer is disposed on the first surface. The first inductor is disposed on the first surface and includes a first conductive coil in a solenoid form penetrating the first dielectric layer and a first magnetic flux axis of which the direction is substantially parallel to the first surface. The second dielectric layer is disposed on the second surface. The second inductor is disposed on the second surface and includes a second conductive coil in a solenoid form penetrating the second dielectric layer and a second magnetic flux axis of which the direction is substantially parallel to the second surface. A manufacturing method of a circuit board structure is provided.

20 Claims, 6 Drawing Sheets

(51) Int. Cl.
*H01F 41/04* (2006.01)
*H05K 1/11* (2006.01)

(56) References Cited

U.S. PATENT DOCUMENTS

| 2016/0233292 A1 | 8/2016 | Chen |
| 2017/0187345 A1 | 6/2017 | Yun et al. |

CIRCUIT BOARD STRUCTURE AND MANUFACTURING METHOD THEREOF

CROSS-REFERENCE TO RELATED APPLICATION

This application claims the priority benefit of Taiwan application serial no. 106143691, filed on Dec. 13, 2017. The entirety of the above-mentioned patent application is hereby incorporated by reference herein and made a part of this specification.

BACKGROUND

1. Technical Field

The disclosure relates to a circuit board structure and a manufacturing method thereof. More particularly, the disclosure relates to a circuit board structure having an inductor and a manufacturing method of the circuit board structure.

2. Description of Related Art

With an increasing demand for functional electronic products, high-speed signal transmission, and high-density circuit components, functions of integrated circuit chips are becoming more advanced, while quantities of passive components for microwave communication products and consumer electronic products are also increasing significantly. Besides, due to the requirements for light weight, thinness, and compactness of electronic products, how to accommodate a large number of electronic components in a limited package space has become a technical bottleneck to be addressed or removed by electronics package industry. To solve this problem, package technologies have been gradually moving towards a "system in package (SIP)" system integration stage, especially a multi-chip module (MCM) packaging. Here, embedded technologies for active components and passive components have become the key technologies. The volume of the package may be greatly reduced by embedding the components, and more electronic components with great functionality may be placed inside the package to increase a layout area of a substrate surface, so as to reduce the thickness of the electronic products.

Generally, it is common to punch holes at first in a carrier surface of a conventional circuit board structure, and then a plurality of passive components (e.g., inductors) are disposed and welded on a carrier (i.e., commonly known as mounting a component). However, in such an arrangement method, the width of each passive component and the minimum distance among the plurality of passive components are above a millimeter (mm) level, and therefore it is difficult to reduce the volume of the circuit board structure. In addition, in the aforementioned arrangement method, the distance among the inductors is comparatively large, so it is more difficult to achieve inductive coupling. Therefore, with the need for light weight, thinness, and compactness of electronic products, how to further reduce the volume of the inductors and the volume of the circuit board structure and simultaneously maintain sufficient inductance performance has already become an urgent issue to be solved.

SUMMARY

The disclosure provides a circuit board structure and a manufacturing method thereof, which may improve an inductance performance of the circuit board structure and reduce a volume of the circuit board structure.

A circuit board structure provided in an embodiment of the invention includes an insulating layer, a first dielectric layer, a first inductor, a second dielectric layer, and a second inductor. The insulating layer includes a first conductive through hole, a first surface, and a second surface opposite to the first surface. The first conductive through hole penetrates the insulating layer to connect the first surface and the second surface. The first inductor is disposed on the first surface of the insulating layer and electrically connected to the first conductive through hole. The first inductor includes a first conductive coil and a first magnetic flux axis, wherein the first conductive coil in a solenoid form penetrates the first dielectric layer, and a direction of the first magnetic flux axis is substantially parallel to the first surface. The second dielectric layer is disposed on the second surface. The second inductor is disposed on the second surface of the insulating layer and electrically connected to the first conductive through hole. The second inductor includes a second conductive coil and a second magnetic flux axis, wherein the second conductive coil in a solenoid form penetrates the second dielectric layer, and a direction of the second magnetic flux axis is substantially parallel to the second surface.

In an embodiment of the invention, the insulating layer includes a core layer.

In an embodiment of the invention, a material of the core layer is different from materials of the first dielectric layer and the second dielectric layer. The material of the core layer includes a polymer glass fiber composite substrate, a glass substrate, a ceramic substrate, an insulator-on-silicon substrate, or a polyimide (PI) glass fiber composite substrate.

In an embodiment of the invention, a material of the insulating layer is identical to materials of the first dielectric layer and the second dielectric layer.

In an embodiment of the invention, the first conductive coil includes a plurality of first upper coil patterns, a plurality of first lower coil patterns, and a plurality of first conductive blind holes. The first upper coil patterns are arranged in parallel and disposed on the first surface of the insulating layer. The first lower coil patterns are arranged in parallel and disposed on the first dielectric layer. The first conductive blind holes penetrate the first dielectric layer to electrically connect the first upper coil patterns and the first lower coil patterns.

In an embodiment of the invention, the second conductive coil includes a plurality of second upper coil patterns, a plurality of second lower coil patterns, and a plurality of second conductive blind holes. The second upper coil patterns are arranged in parallel and disposed on the second surface of the insulating layer. The second lower coil patterns are arranged in parallel and disposed on the second dielectric layer. The second conductive blind holes penetrate the second dielectric layer to electrically connect the second upper coil patterns and the second lower coil patterns.

In an embodiment of the invention, the first inductor on the insulating layer at least partially overlaps the second inductor in an orthogonal projection direction.

In an embodiment of the invention, a minimum vertical distance from the first inductor to the second inductor is less than or equal to 100 μm.

In an embodiment of the invention, the circuit board structure further includes a third inductor. The third inductor is disposed on one side of the first inductor and the second inductor and electrically coupled to the first inductor or the second inductor. The third inductor includes a third conductive coil and a third magnetic flux axis, wherein the third conductive coil in a solenoid form penetrates the insulating layer, and a direction of the third magnetic flux axis is substantially parallel to the first surface.

In an embodiment of the invention, the third conductive coil includes a plurality of third upper coil patterns, a plurality of third lower coil patterns, and a plurality of third conductive through holes. The third upper coil patterns are disposed on the first surface of the insulating layer. The third lower coil patterns are disposed on the second surface of the insulating layer. The third conductive through holes penetrate the insulating layer to electrically connect the third upper coil patterns and the third lower coil patterns.

In an embodiment of the invention, the third conductive coil includes a plurality of third upper coil patterns, a plurality of third lower coil patterns and a plurality of third conductive though holes. The third upper coil patterns are disposed on the first dielectric layer, the third lower coil patterns are disposed on the second dielectric layer, and the third conductive though holes penetrate the insulating layer, the first dielectric layer, and the second dielectric layer to electrically connect the third upper coil patterns and the third lower coil patterns.

In an embodiment of the invention, a minimum horizontal distance from the third inductor to the first inductor or the second inductor is less than or equal to 100 μm.

In an embodiment of the invention, the third conductive through holes include a solid conductive post, a hollow conductive through holes, or an X-type conductive through hole.

A manufacturing method of a circuit board structure provided in an embodiment of the invention includes following steps. An insulating layer is provided. The insulating layer includes a first conductive through hole, a first surface, and a second surface opposite to the first surface. The first conductive through hole penetrates the insulating layer to connect the first surface and the second surface. A plurality of first upper coil patterns parallel to one another are formed on the first surface of the insulating layer. A first dielectric layer is formed on the first upper coil patterns. A plurality of first conductive blind holes penetrating the first dielectric layer is formed. A plurality of first lower coil patterns parallel to one another are formed on the first dielectric layer, wherein the first lower coil patterns are electrically connected to the first upper coil patterns via the first conductive blind holes, and the first upper coil patterns, the first conductive blind holes, and the first lower coil patterns constitute a first inductor. A plurality of second upper coil patterns parallel to one another are formed on the second surface of the insulating layer. A second dielectric layer is formed on the second upper coil patterns. A plurality of second conductive blind holes penetrating the second dielectric layer is formed. A plurality of second lower coil patterns parallel to one another is formed on the second dielectric layer, wherein the second lower coil patterns are electrically connected to the second upper coil patterns via the second conductive blind holes, and the second upper coil patterns, the second conductive blind holes, and the second lower coil patterns constitute a second inductor.

In an embodiment of the invention, an extension direction of the first upper coil patterns is different from an extension direction of the first lower coil patterns, and an extension direction of the second upper coil patterns is different from an extension direction of the second lower coil patterns.

In an embodiment of the invention, the first inductor on the insulating layer at least partially overlaps the second inductor in an orthogonal projection direction.

In an embodiment of the invention, a minimum vertical distance from the first inductor to the second inductor is less than or equal to 100 μm.

In an embodiment of the invention, the manufacturing method of the circuit board structure further includes following steps. A plurality of third conductive through holes penetrating the insulating layer is formed. A plurality of third upper coil patterns is formed on the first surface of the insulating layer. A plurality of third lower coil patterns is formed on the second surface of the insulating layer, wherein the third lower coil patterns are electrically connected to the third upper coil patterns via the third conductive through holes, and the third upper coil patterns, the third conductive through holes, and the third lower coil patterns constitute a third inductor.

In an embodiment of the invention, a minimum horizontal distance from the third inductor to the first inductor or the second inductor is less than or equal to 100 μm.

In an embodiment of the invention, the first dielectric layer is disposed between the third upper coil patterns and the insulating layer.

In an embodiment of the invention, the second dielectric layer is located between the third lower coil patterns and the insulating layer.

Based on the above, in an embodiment of the invention, the first conductive coil of the first inductor in a solenoid form penetrates the first dielectric layer, and the second conductive coil of the second inductor in a solenoid form penetrates the second dielectric layer, so that the volume of an electronic component may be reduced. In addition, the direction of the first magnetic flux axis of the first inductor is substantially parallel to the first surface of the insulating layer, the direction of the second magnetic flux axis of the second inductor is substantially parallel to the second surface of the insulating layer, and the minimum vertical distance from the first inductor to the second inductor may be less than or equal to 100 μm. Hence, the inductive coupling between the first inductor and the second inductor may enhance the inductance performance.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
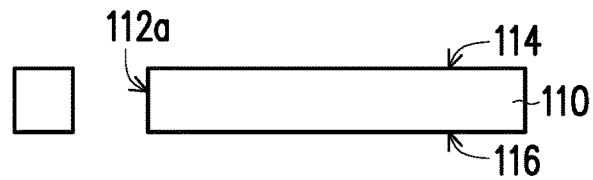
FIG. 1A to FIG. 1H are schematic cross-sectional views of a manufacturing method of a circuit board structure according to a first embodiment of the invention.

In the following detailed description of the embodiments, reference is made to the accompanying drawings which form a part hereof, and in which are shown by way of illustrating specific embodiments in which the invention may be practiced. In this regard, directional terminology, such as "top," "bottom," "front," "back," "left," "right," etc., is used with reference to the orientation of the Figure(s) being described. The components provided in one or some embodiments of the invention can be positioned in a number of different orientations. As such, the directional terminology is used for purposes of illustration and is in no way limiting. Also, identical or similar devices are given identical or similar reference numerals in any of the following embodiments.

FIG. 1A to FIG. 1H are schematic cross-sectional views of a manufacturing method of a circuit board structure according to a first embodiment of the invention. FIG. 1I is a schematic three-dimensional view of a partial circuit board structure according to the first embodiment of the invention. FIG. 1J is a schematic top view of a partial circuit board structure according to a second embodiment of the invention, and parts or some film layers are omitted in FIG. 1J. Specifically, FIG. 1I is a schematic three-dimensional view of a partial one of a plurality of inductors in a circuit board structure according to the first embodiment of the invention.

A manufacturing method of a circuit board structure provided in the embodiment includes following steps. Referring to FIG. 1A, an insulating layer 110 is provided, wherein the insulating layer 110 includes a through hole 112a, a first surface 114, and a second surface 116. The first surface 114 and the second surface 116 are opposite to each other, and the through hole 112a penetrates the insulating layer 110 to connect or communicate the first surface 114 and the second surface 116. The through hole 112a penetrating the insulating layer 110 as provided in the embodiment may be formed, for example, by mechanical drilling or laser drilling. Certainly, the embodiment is provided to exemplify the invention, and the disclosure does not limit the way to form the through hole 112a.

In the embodiment, the insulating layer 110 may include a core layer, and the core layer may include a polymer glass fiber composite substrate, a glass substrate, a ceramic substrate, an insulator-on-silicon substrate, or a polyimide (PI) glass fiber composite substrate; the disclosure is not limited thereto. In other embodiments, the insulating layer 110 may be a dielectric layer having a single layer of a dielectric material or multiple layers of the dielectric material.

Figure 1B:
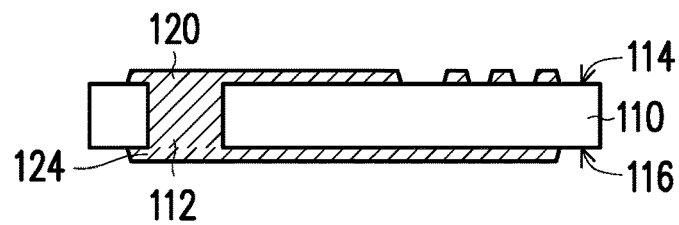

Next, referring to FIG. 1B, in certain embodiments, a patterned circuit layer 120 may be formed on the first surface 114 of the insulating layer 110, and/or a patterned circuit layer 124 may be formed on the second surface 116 of the insulating layer 110. The patterned circuit layer 120 and the patterned circuit layer 124 may be simultaneously formed during the same circuit production step. Specifically, a manufacturing method of the patterned circuit layer 120 and/or the patterned circuit layer 124 may, for example, include following steps. A conductive material may be formed on the first surface 114 and/or the second surface 116 of the insulating layer 110 via a deposition process and/or a plating process or other suitable processes. The through hole 112a (shown in FIG. 1A) of the insulating layer 110 may be further filled with the conductive material to form a first conductive through hole 112 having conductivity. After that, the conductive material covering the first surface 114 of the insulating layer 110 may be patterned by, for example, a photolithography and etching process to form the patterned circuit layer 120. Alternatively, the conductive material covering the second surface 116 of the insulating layer 110 may be patterned by, for example, the photolithography and etching process to form the patterned circuit layer 124. Taking conductivity into consideration, a material of the patterned circuit layer 120 and/or the patterned circuit layer 124 is generally metal, but the disclosure is not limited thereto.

Figure 1C:
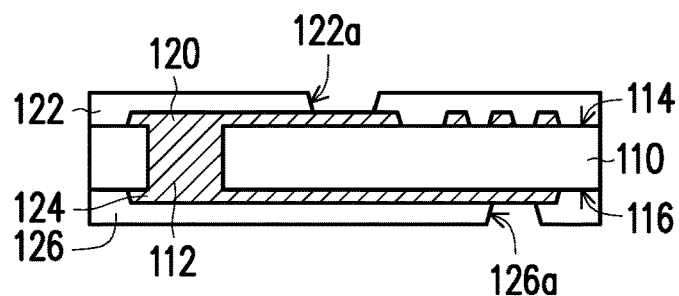

Next, referring to FIG. 1C, a patterned dielectric layer 122 is optionally formed on the patterned circuit layer 120, and a patterned dielectric layer 126 is optionally formed on the patterned circuit layer 124. The patterned dielectric layers 122 and 126 may have a plurality of dielectric layer openings 122a and 126a to expose portions of the patterned circuit layers 120 and 124. A material of the patterned dielectric layers 122 and 126 may include an inorganic material (e.g., silicon oxide, silicon nitride, silicon oxynitride, other suitable materials, or a stacked layer of at least two of the above materials), an organic material, a photosensitive dielectric material, or other suitable dielectric materials. For example, an inorganic dielectric material covering the patterned circuit layer 120 may be formed on the first surface 114 of the insulating layer 110 via the deposition process or other suitable processes. After that, the dielectric layer openings 122a may be formed by the inorganic dielectric material covering the patterned circuit layer 120 via the photolithography and etching process. In another example, an organic dielectric material covering the patterned circuit layers 120 and 124 may be formed on the first surface 114 and the second surface 116 of the insulating layer 110 via a coating method, an adhesion method, a sol-gel method, a lamination method, or other suitable methods. After that, based on its properties, the organic dielectric material may be cured via a photopolymerization process or a baking process, and then the dielectric layer openings 122a and 126a may be formed by the organic dielectric material covering the patterned circuit layers 120 and 124 via a development process, an etching process, a drilling process, or other suitable processes.

Figure 1D:
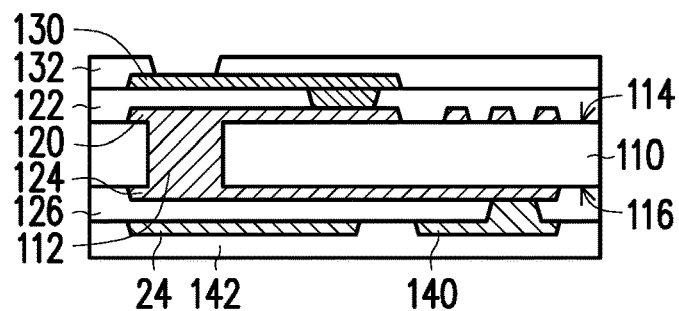

Next, referring to FIG. 1D, in certain embodiments, after the patterned dielectric layers 122 and 126 are formed, a patterned circuit layer 130 and a patterned dielectric layer 132 may be sequentially formed on the patterned dielectric layer 122, while a patterned circuit layer 140 and a patterned dielectric layer 142 may be sequentially formed on the patterned dielectric layer 126. The way to form the patterned circuit layers 130 and 140 may be similar to the aforementioned way to form the patterned circuit layers 120 and 124, while the way to form the patterned dielectric layers 132 and 142 may be similar to the aforementioned way to form the patterned dielectric layers 122 and 126; no relevant descriptions will be provided hereinafter.

In certain embodiments, a portion of the patterned circuit layer 140 may be a plurality of second upper coil patterns 24, and the second upper coil patterns 24 may be electrically connected to the patterned circuit layer 124 on other cross-sections not depicted in the drawing.

In the embodiment, if the insulating layer 110 is the core layer, a double sided wiring board may be formed by the insulating layer 110, the patterned circuit layers 120 and 130 on the first surface 114, and the patterned circuit layers 124 and 140 on the second surface 116, and then other film layers may be continuously stacked on two opposite sides of the double sided wiring board. The above steps of forming the patterned circuit layers 120, 124, 130, and 140 as well as the steps of forming the patterned dielectric layers 122, 126, 132, and 142 (i.e., the steps shown in FIG. 1B to FIG. 1D) may be optional steps and may be omitted. Besides, the number of the patterned circuit layers and the number of the patterned dielectric layers formed on the insulating layer 110 are not limited in the disclosure.

Figure 1E:
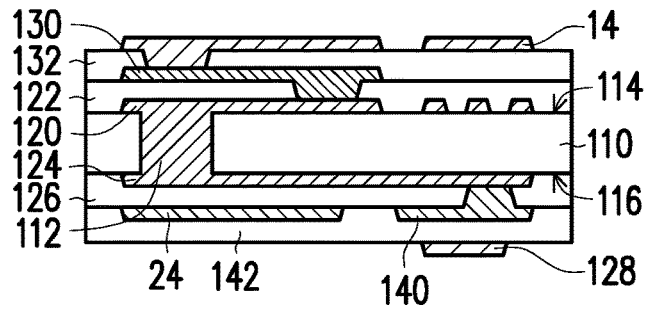

Next, referring to FIG. 1E, a plurality of first upper coil patterns 14 parallel to one another are formed on the first surface 114 of the insulating layer 110. The way to form the first upper coil patterns 14 may be similar to the aforementioned way to form the patterned circuit layers 120 and thus is not described in detail hereinafter. In the schematic cross-sectional view of FIG. 1E, only one of the plurality of first upper coil patterns 14 is shown because of the position of the cross-section. The parallel relationship among first upper coil patterns 14 may be shown in FIG. 1I or FIG. 1J.

Referring to FIG. 1E, the second upper coil patterns 24 parallel to one another are formed on the second surface 116 of the insulating layer 110. The way to form the second upper coil patterns 24 and the pattern of the second upper coil patterns 24 may be similar to the aforementioned way to form the first upper coil patterns 14 and the pattern of the first upper coil patterns 14, and thus no relevant descriptions will be provided hereinafter. The sequences of forming the first upper coil patterns 14 and the second upper coil patterns 24 are not limited in the embodiment.

In certain embodiments, a patterned circuit layer 128 may be optionally formed on the second surface 116 of the insulating layer 110. The way to form the patterned circuit layer 128 may be similar to the aforementioned way to form the patterned circuit layer 120 and thus is not described in detail herein.

Figure 1F:
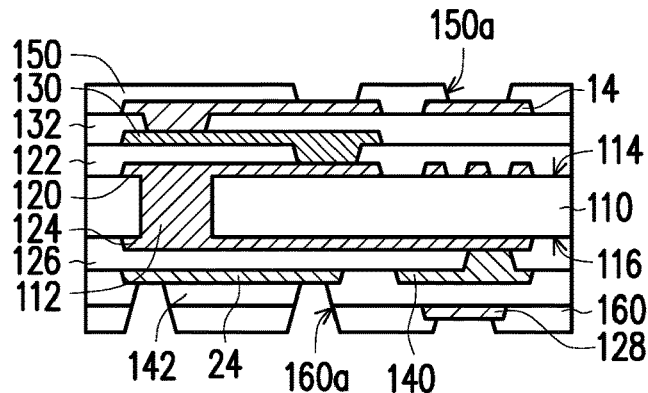

Next, referring to FIG. 1F, after the first upper coil patterns 14 are formed, a first dielectric layer 150 is formed on the first upper coil patterns 14. The first dielectric layer 150 has a plurality of first openings 150*a* to expose opposite ends of each of the plurality of first upper coil patterns 14. The way to form the first dielectric layer 150 may be similar to the aforementioned way to form the patterned dielectric layer 122, and the way to form the first openings 150*a* on the first dielectric layer 150 may be similar to the aforementioned way to form the dielectric layer openings 122*a* of the patterned dielectric layer 122, and thus no relevant descriptions will be provided hereinafter.

Referring to FIG. 1F, after the second upper coil patterns 24 are formed, a second dielectric layer 160 is formed on the second upper coil patterns 24. The second dielectric layer 160 has a plurality of second openings 160*a* penetrating the second dielectric layer 160 and the patterned dielectric layer 142 to expose opposite ends of each of the plurality of second upper coil patterns 24. The way to form the second dielectric layer 160 may be similar to the aforementioned way to form the first dielectric layer 150, and the way to form the second openings 160*a* on the second dielectric layer 160 may be similar to the aforementioned way to form the first openings 150*a* on the first dielectric layer 150, and thus no relevant descriptions will be provided hereinafter.

The sequences of forming the first dielectric layer 150 and the second dielectric layer 160 are not limited in the embodiment, and the first dielectric layer 150 and the second dielectric layer 160 may also be formed simultaneously.

Figure 1G:
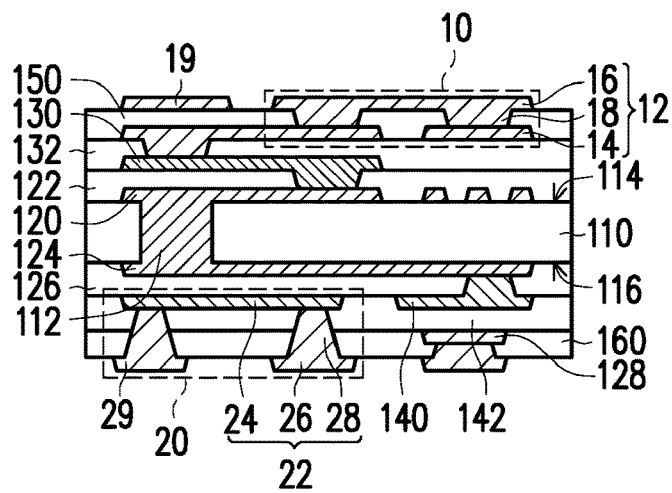

Next, referring to FIG. 1G, after the first dielectric layer 150 is formed, a plurality of first lower coil patterns 16 is formed on the first dielectric layer 150. The first openings 150*a* (shown in FIG. 1F) of the first dielectric layer 150 may be further filled with the conductive material used to form the first lower coil patterns 16, so as to form a plurality of first conductive blind holes 18. As shown in FIG. 1I, two of the first conductive blind holes 18 may respectively connect opposite ends of the same one of the first upper coil patterns 14, so that each of the first upper coil patterns 14 is electrically connected to an adjacent one of the first lower coil patterns 16 via the first conductive blind holes 18 disposed on the first upper coil patterns 14. The way to form the first lower coil patterns 16 may be similar to the aforementioned way to form the first upper coil patterns 14 and thus is not described in detail herein. In the schematic cross-sectional view of FIG. 1G, only one of the first upper coil patterns 14 is shown because of the position of the cross-section. The parallel relationship among the first upper coil patterns 14 may be shown in FIG. 1I or FIG. 1J.

As shown in FIG. 1I, the plurality of first upper coil patterns 14, the plurality of first conductive blind holes 18, and the plurality of first lower coil patterns 16 may constitute a first inductor 10 having a first conductive coil 12. In other words, the first conductive coil 12 of the first inductor 10 in a solenoid form penetrates the first dielectric layer 150. Thereby, a direction of a first magnetic flux axis 10*a* of the first inductor 10 is substantially parallel to the first surface 114. The first inductor 10 provided in the embodiment may have self-inductance, but the disclosure is not limited thereto. In other embodiments, the first inductor 10 may also have mutual inductance.

In the embodiment, a first pad 19 may be formed on the first dielectric layer 150 and may be electrically connected to the first inductor 10, so that the first inductor 10 is electrically connected to other electronic components via the first pad 19. In the embodiment, the first pad 19 and the first lower coil patterns 16 may be the same patterned conductive layer, but the disclosure is not limited thereto.

Referring to FIG. 1G, after the second dielectric layer 160 and its second openings 160*a* are formed, a plurality of second lower coil patterns 26 are formed on the second dielectric layer 160. Besides, the second openings 160*a* (shown in FIG. 1F) of the second dielectric layer 160 may be further filled with the conductive material used to form the second lower coil patterns 26, so as to form a plurality of second conductive blind holes 28. Two of the second conductive blind holes 28 may respectively connect opposite ends of the same one of the second upper coil patterns 24, so that each of the second upper coil patterns 24 is electrically connected to an adjacent one of the second lower coil patterns 26 via the second conductive blind holes 28 disposed on the second upper coil patterns 24. The way to form the second lower coil patterns 26 may be similar to the aforementioned way to form the second upper coil patterns 24 and thus is not described in detail herein.

Similar to the first inductor shown in FIG. 1I, the second upper coil patterns 24, the second conductive blind holes 28, and the second lower coil patterns 26 may constitute a second inductor 20 having a second conductive coil 22. In other words, the second conductive coil 22 of the second inductor 20 in a solenoid form penetrates the second dielectric layer 160. Thereby, a direction of a second magnetic flux axis 20a of the second inductor 20 is substantially parallel to the second surface 116. The second inductor 20 provided in the embodiment may have self-inductance, but the disclosure is not limited thereto. In other embodiments, the second inductor 20 may also have mutual inductance.

In the embodiment, the first inductor 10 may be serially and electrically connected to the second inductor 20, and the direction of the first magnetic flux axis 10a of the first inductor 10 and the direction of the second magnetic flux axis 20a of the second inductor 20 are substantially identical. Thereby, an inductance performance of the circuit board structure 100 may be improved by the serial connection of the first inductor 10 and the second inductor 20. In some embodiments, a minimum vertical distance D1 from the first inductor 10 to the second inductor 20 is less than or equal to 100 μm, so that the first inductor 10 and the second inductor 20 both having a three-dimensional solenoid structure may enhance inductance coupling, thereby improving the inductance performance in a limited space.

In the embodiment, a second pad 29 may be formed on the second dielectric layer 160 and may be electrically connected to the second inductor 20, so that the second inductor 20 is electrically connected to other electronic components via the second pad 29. In the embodiment, the second pad 29 and the second lower coil patterns 26 may be the same patterned conductive layer, but the disclosure is not limited thereto.

Figure 1H:
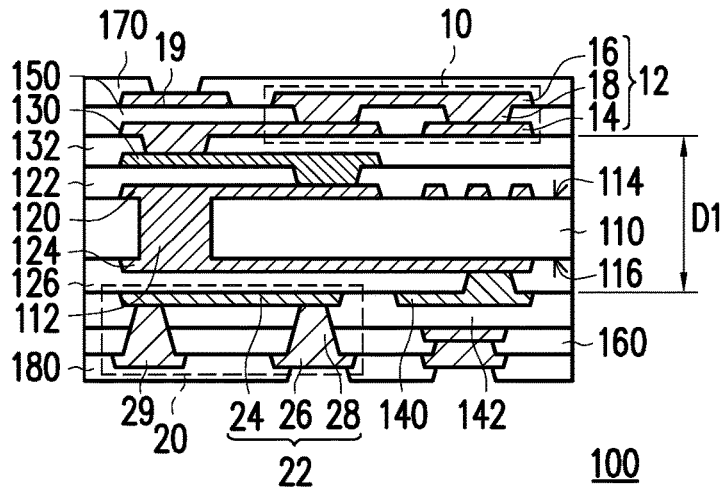
Figure 1I:
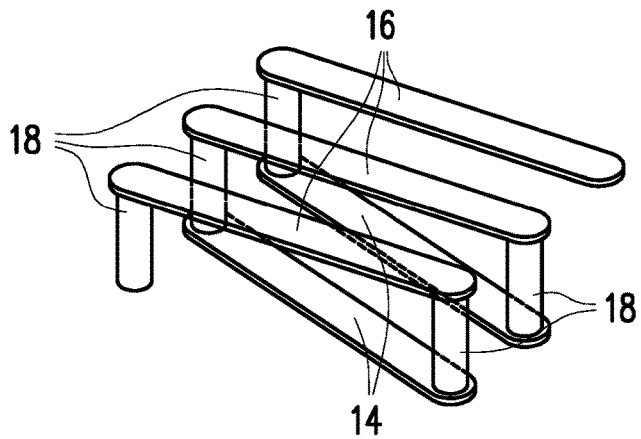
FIG. 1I is a schematic three-dimensional view of a partial circuit board structure according to the first embodiment of the invention.
Figure 1J:
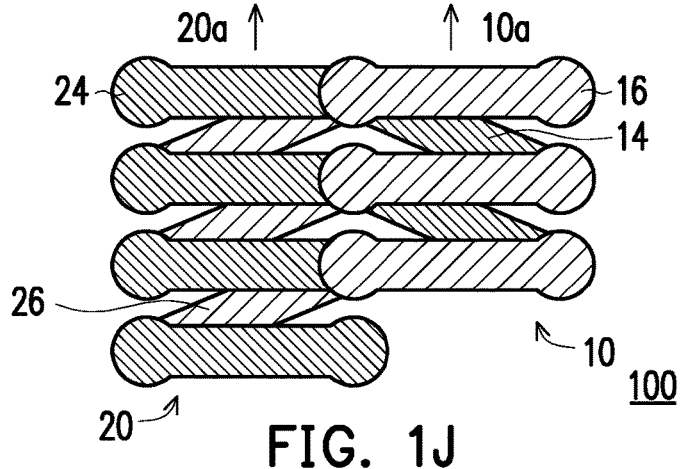
FIG. 1J is a schematic top view of a partial circuit board structure according to a second embodiment of the invention.

Next, referring to FIG. 1H, after the first lower coil patterns 16 are formed, a first passivation layer 170 may be formed on the plurality of first lower coil patterns 16, and the first passivation layer 170 may expose the first pad 19. The first passivation layer 170 may be a solder mask or a dry film, but the disclosure is not limited thereto.

Referring to FIG. 1H, after the second lower coil patterns 26 are formed, a second passivation layer 180 may be formed on the second lower coil patterns 26, and the second passivation layer 180 may expose the second pad 29. The second passivation layer 180 may be the solder mask or the dry film, but the disclosure is not limited thereto. The sequences of forming the first passivation layer 170 and the second passivation layer 180 are not limited in the embodiment. Surface treatment is further performed on surfaces of the first pad 19 and the second pad 29 by forming a layer of organic solderability preservatives (OSP), nickel gold, palladium gold, nickel palladium gold, nickel silver, palladium silver, nickel palladium silver, etc., but the disclosure is not limited thereto.

After the above manufacturing process is performed, the circuit board structure 100 provided in the embodiment is substantially formed. Structurally, the circuit board structure 100 provided in the embodiment includes the insulating layer 110, the first dielectric layer 150, the first inductor 10, the second dielectric layer 160, and the second inductor 20. The insulating layer 110 includes the first conductive through hole 112, the first surface 114, and the second surface 116 opposite to the first surface 114. The first conductive through hole 112 penetrates the insulating layer 110 to connect the first surface 114 and the second surface 116. The first inductor 10 is located on the first surface 114 of the insulating layer 110 and electrically connected to the first conductive through hole 112. The first inductor 19 includes the first conductive coil 12 and the first magnetic flux axis 10a, wherein the first conductive coil 12 in a solenoid form penetrates the first dielectric layer 150, and the direction of the first magnetic flux axis 10a is substantially parallel to the first surface 114. The second dielectric layer 160 is disposed on the second surface 116. The second inductor 20 is located on the second surface 116 of the insulating layer 110 and electrically connected to the first conductive through hole 112. The second inductor 20 includes the second conductive coil 22 and the second magnetic flux axis 20a, wherein the second conductive coil 22 in a solenoid form penetrates the second dielectric layer 160, and the direction of the second magnetic flux axis 20a is substantially parallel to the second surface 116.

In the embodiment, the insulating layer 110 may be the core layer, and a material of the core layer may be different from materials of the first dielectric layer 150 and/or the second dielectric layer 160. The material of the core layer 110 may include the polymer glass fiber composite substrate, the glass substrate, the ceramic substrate, the silicon-on-insulator substrate, the PI glass fiber composite substrate, or other similar rigid dielectric materials. In other words, the circuit board structure 100 provided in the embodiment may be a core circuit board structure having the core layer, but the disclosure is not limited thereto. In other embodiments, a material of the insulating layer 110 is identical or similar to materials of the first dielectric layer 150 and/or the second dielectric layer 160. That is, the insulating layer 110 may be a normal dielectric layer. Thus, the circuit board structure 100 may be a coreless circuit board structure, a manufacturing process of which may be, for example, forming the first inductor 10, the second inductor 20, and other stacked film layers on opposite surfaces of a carrier and then removing the carrier to form two independent coreless circuit board structures.

In the embodiment, the first inductor 10 on the insulating layer 110 at least partially overlaps the second inductor 20 in an orthogonal projection direction or in a vertical projection direction, and a minimum distance (the minimum vertical distance D1 and/or a minimum horizontal distance) from the first inductor 10 to the second inductor 20 is less than or equal to 100 μm, so that the first inductor 10 and the second inductor 20 both having the three-dimensional solenoid structure may enhance the inductance coupling, thereby improving the inductance performance in the limited space of the circuit board structure 100.

FIG. 2A to FIG. 2D are schematic cross-sectional views of some steps of a manufacturing method of a circuit board structure according to the second embodiment of the invention. Some steps of manufacturing the circuit board structure provided in the embodiment are identical or similar to the manufacturing steps shown in FIG. 1A to FIG. 1H, and similar components are marked by identical or similar reference numerals and have similar function or may be formed in a similar manner, and thus relevant descriptions are omitted hereinafter. Specifically, in the embodiment, the steps of forming the first inductor 10 and the second inductor 20 of the circuit board structure 100 may be similar to those depicted in FIG. 1A to FIG. 1H, and thus detailed descriptions are omitted herein in consideration of conciseness.

Figure 2A:
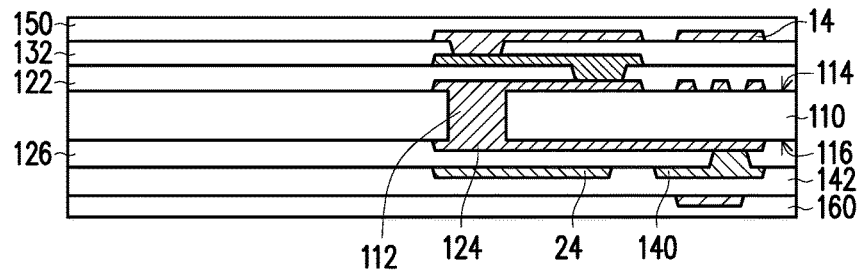
FIG. 2A to FIG. 2D are schematic cross-sectional views of some steps of a manufacturing method of a circuit board structure according to the second embodiment of the invention.

Simultaneously referring to FIG. 1E and FIG. 2A, after the first upper coil patterns 14 and the second upper coil patterns 24 as shown in FIG. 1E are formed, the first dielectric layer 150 may be formed on the first upper coil patterns 14, and the second dielectric layer 160 may be formed on the second upper coil patterns 24.

Figure 2B:
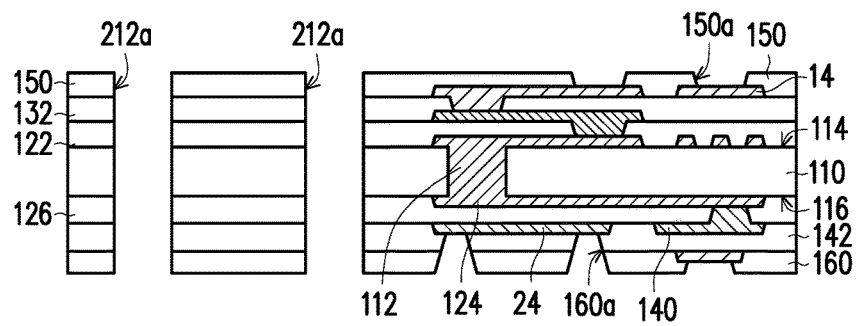

Next, referring to FIG. 2B, a plurality of through holes 212a penetrating the insulating layer 110, the patterned dielectric layers 122, 126, 132, and 142 (if any), the first dielectric layer 150, and the second dielectric layer 160 may be formed via mechanical drilling or laser drilling.

Figure 2C:
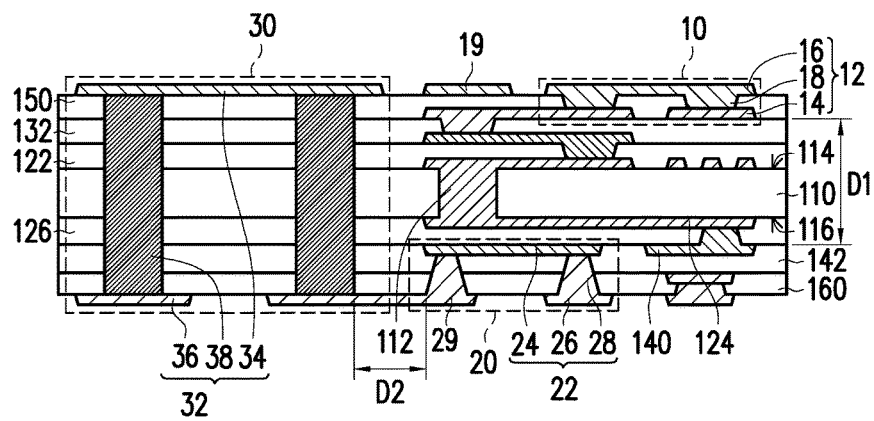

Next, referring to FIG. 2C, after the through holes 212a are formed, the conductive material may be formed on the first dielectric layer 150 and/or the second dielectric layer 160 via the deposition process and/or the plating process or other suitable processes. Besides, the through holes 212a (shown in FIG. 2B) may be further filled with the conductive material to form a plurality of third conductive through holes 38 having conductivity.

Referring to FIG. 2C, the conductive material covering the first dielectric layer 150 may be patterned by the photolithography and etching process to simultaneously form a plurality of third upper coil patterns 34 during the step of forming the first lower coil patterns 16. In addition, the conductive material covering the second dielectric layer 160 may be patterned by the photolithography and etching process to simultaneously form a plurality of third lower coil patterns 36 during the step of forming the second lower coil patterns 26. According to the embodiment, the third upper coil patterns and the third lower coil patterns may be simultaneously formed during the same circuit production step. In other embodiments, the sequences of forming the third upper coil patterns 34 and the plurality of third lower coil patterns 36 are not limited. Besides, in the schematic cross-sectional view of FIG. 2C, only one of the third upper coil patterns 34 and one of the third lower coil patterns 36 are shown because of the position of the cross-section. The parallel relationship among the third upper coil patterns 34 may be shown in FIG. 2E.

Similar to the first inductor 10 shown in FIG. 1I, the third upper coil patterns 34, the third conductive through holes 38, and the third lower coil patterns 36 may constitute a third inductor 30 having a third conductive coil 32. In other words, the third conductive coil 32 of the third inductor 30 in a solenoid form penetrates the insulating layer 110, the patterned dielectric layers 122, 126, 132, and 142 (if any), the first dielectric layer 150, and the second dielectric layer 160. Thereby, a direction of a third magnetic flux axis 30a of the third inductor 30 is substantially parallel to the first surface 114 and/or the second surface 116 of the insulating layer 110. The third inductor 30 provided in the embodiment may have self-inductance, but the disclosure is not limited thereto. In other embodiments, the third inductor 30 may also have mutual inductance.

In the embodiment, the third inductor 30 may be serially and electrically connected to the second inductor 20, and the direction of the third magnetic flux axis 30a of the third inductor 30 and the direction of the second magnetic flux axis 20a of the second inductor 20 are substantially identical. Thereby, the inductance performance of the circuit board structure 100 may be improved by the third inductor 30 and the second inductor 20. In some embodiments, the minimum horizontal distance from the third inductor 30 to the second inductor 20 is less than or equal to 100 μm, so that the third inductor 30 and the second inductor 20 both having the three-dimensional solenoid structure may enhance inductance coupling, thereby improving the inductance performance in the limited space. In other feasible embodiments, the minimum distance from the third inductor 30 to the first inductor 10 may also be less than or equal to 100 μm, so that the third inductor 30 and the first inductor 10 may enhance inductance coupling, thereby improving the inductance performance in the limited space.

In the embodiment, the first lower coil patterns 16 and the third upper coil patterns 34 may be located in the same layer, and the second lower coil patterns 26 and the third lower coil patterns 36 may be located in the same layer, but the disclosure is not limited thereto. In other embodiments, the first lower coil patterns 16 and the third upper coil patterns 34 may be respectively located in different film layers, and/or the second lower coil patterns 26 and the third lower coil patterns 36 may be respectively located in different film layers. For example, the first upper coil patterns 14 and the third upper coil patterns 34 may be located in the same film layer, and/or the second upper coil patterns 24 and the third lower coil patterns 36 may be located in the same film layer. In other embodiments, the third conductive coil 32 of the third inductor 30 at least in a solenoid form may penetrate the insulating layer 110 and is electrically connected to the first inductor 10 or the second inductor 20. Accordingly, the third upper coil patterns 34 and the patterned circuit layer 120 may be, for example, formed in the same step, and the third lower coil patterns 36 and the patterned circuit layer 140 may be, for example, formed in the same step.

Figure 2D:
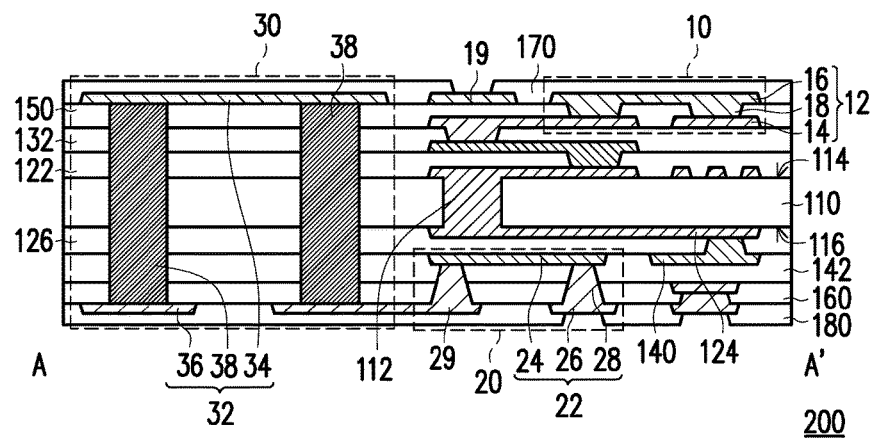

Next, referring to FIG. 2D, after the third upper coil patterns 34 are formed, the first passivation layer 170 may be formed on the third upper coil patterns 34 Besides, after the third lower coil patterns 36 are formed, the second passivation layer 180 may be formed on the third lower coil patterns 36. The sequences of forming the first passivation layer 170 and the second passivation layer 180 are not limited in the embodiment.

Figure 2E:
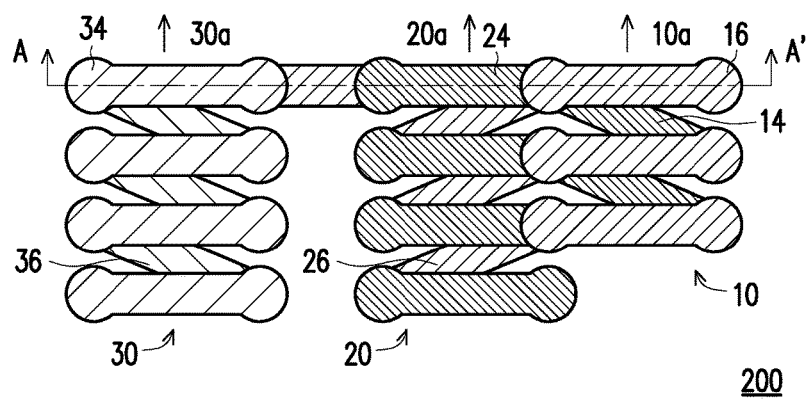
FIG. 2E is a schematic top view of a partial circuit board structure according to the second embodiment of the invention.

After the above manufacturing process is performed, the circuit board structure 200 provided in the embodiment is substantially formed. Simultaneously referring to FIG. 2D and FIG. 2E, FIG. 2E is a schematic top view of a partial circuit board structure according to the second embodiment of the invention, FIG. 2D is a schematic cross-sectional view taken along a sectional line A-A' in FIG. 2E, and a portion of film layers is omitted in FIG. 2E. In the embodiment, the circuit board structure 200 is similar to the circuit board structure 100, while the circuit board structure 200 further includes the third inductor 30 comprised of the third upper coil patterns 34, the third lower coil patterns 36, and the third conductive through holes 38.

In the embodiment, the third conductive through holes 38 of the third inductor 30 may be a solid conductive post, but the disclosure is not limited thereto.

Figure 3:
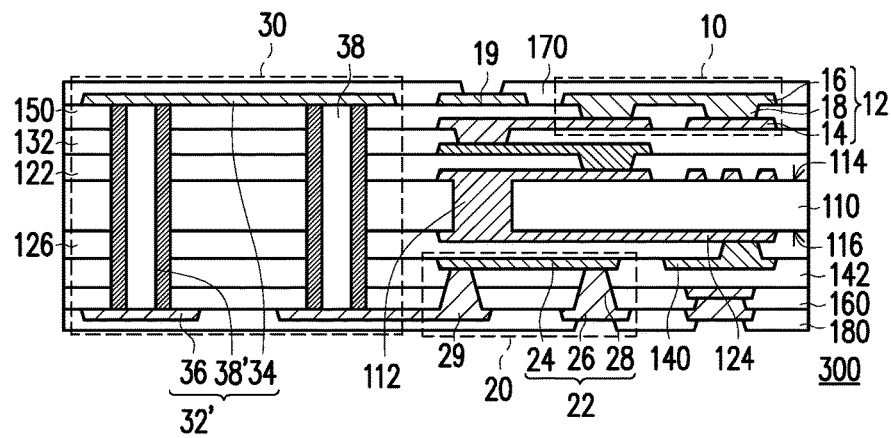
FIG. 3 is a schematic cross-sectional view of a circuit board structure according to a third embodiment of the invention.

FIG. 3 is a schematic cross-sectional view of a circuit board structure according to a third embodiment of the invention. A circuit board structure 300 provided in the third embodiment is similar to the circuit board structure 200 shown in FIG. 2D, while the third upper coil patterns 34, the third lower coil patterns 36, and a plurality of third conductive through holes 38' may constitute a third conductive coil 32' of a third inductor 30'. In other words, the third conductive coil 32' of the third inductor 30' in a solenoid form penetrates the insulating layer 110, the patterned dielectric layers 122, 126, 132, and 142 (if any), the first dielectric layer 150, and the second dielectric layer 160, and the third conductive through holes 38' of the third inductor 30' may be hollow conductive through holes or hollow conductive posts, but the disclosure is not limited thereto.

In some embodiments, the center of the third conductive through holes 38' may be stuffed with a hole plugging resin material or a polymer glass-ceramic composite material, but the disclosure is not limited thereto.

Figure 4:
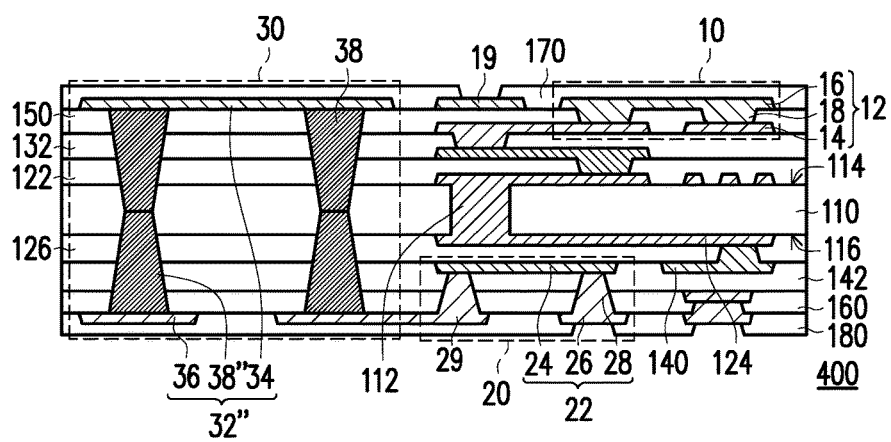
FIG. 4 is a schematic cross-sectional view of a circuit board structure according to a fourth embodiment of the invention.

FIG. 4 is a schematic cross-sectional view of a circuit board structure according to a fourth embodiment of the invention. A circuit board structure 400 provided in the fourth embodiment is similar to the circuit board structure 200 shown in FIG. 2D, while the third upper coil patterns 34, the third lower coil patterns 36, and a plurality of third conductive through holes 38" may constitute a third conductive coil 32" of a third inductor 30". In other words, the third conductive coil 32" of the third inductor 30" in a solenoid form penetrates the insulating layer 110, the patterned dielectric layers 122, 126, 132, and 142 (if any), the first dielectric layer 150, and the second dielectric layer 160, and the third conductive through holes 38" of the third inductor 30" may be X-type conductive through holes.

To sum up, in one or more embodiments of the invention, the first conductive coil of the first inductor in a solenoid form penetrates the first dielectric layer, and the second conductive coil of the second inductor in a solenoid form penetrates the second dielectric layer, so that the size of the inductor and the volume of the circuit board structure may be reduced, thereby meeting the requirement for light weight, thinness, and compactness. Since the direction of the first magnetic flux axis of the first inductor is substantially parallel to the first surface of the insulating layer, the direction of the second magnetic flux axis of the second inductor is substantially parallel to the second surface of the insulating layer, and the minimum distance from the first inductor to the second inductor may be less than or equal to 100 μm, the first inductor and the second inductor may then enhance inductance coupling, thereby improving the inductance performance.

It will be apparent to those skilled in the art that various modifications and variations can be made to the structure described in the disclosure without departing from the scope or spirit of the disclosure. In view of the foregoing, it is intended that the disclosure cover modifications and variations provided they fall within the scope of the following claims and their equivalents.

What is claimed is:

1. A circuit board structure, comprising:
   an insulating layer, comprising a first conductive through hole, a first surface, and a second surface opposite to the first surface, the first conductive through hole penetrating the insulating layer to connect the first surface and the second surface;
   a first dielectric layer, disposed on the first surface;
   a first inductor, disposed on the first surface of the insulating layer and electrically connecting the first conductive through hole, the first inductor comprising a first conductive coil and a first magnetic flux axis, wherein the first conductive coil in a solenoid form penetrates the first dielectric layer, and a direction of the first magnetic flux axis is substantially parallel to the first surface;
   a second dielectric layer disposed on the second surface; and
   a second inductor, located on the second surface of the insulating layer and electrically connecting the first conductive through hole, the second inductor comprising a second conductive coil and a second magnetic flux axis, wherein the second conductive coil in a solenoid form penetrates the second dielectric layer, and a direction of the second magnetic flux axis is substantially parallel to the second surface.

2. The circuit board structure of claim 1, wherein the insulating layer comprises a core layer.

3. The circuit board structure of claim 2, wherein a material of the core layer is different from materials of the first dielectric layer and the second dielectric layer, the material of the core layer comprises a polymer glass fiber composite substrate, a glass substrate, a ceramic substrate, an insulator-on-silicon substrate, or a polyimide glass fiber composite substrate.

4. The circuit board structure of claim 1, wherein a material of the insulating layer is identical to materials of the first dielectric layer and the second dielectric layer.

5. The circuit board structure of claim 1, wherein the first conductive coil comprises:
   a plurality of first upper coil patterns, arranged in parallel with one another and disposed on the first surface of the insulating layer;
   a plurality of first lower coil patterns, arranged in parallel with one another and disposed on the first dielectric layer; and
   a plurality of first conductive blind holes, penetrating the first dielectric layer to electrically connect the plurality of first upper coil patterns and the plurality of first lower coil patterns.

6. The circuit board structure of claim 1, wherein the second conductive coil comprises:
   a plurality of second upper coil patterns, arranged in parallel with one another and disposed on the second surface of the insulating layer;
   a plurality of second lower coil patterns, arranged in parallel with one another and disposed on the second dielectric layer; and
   a plurality of second conductive blind holes, penetrating the second dielectric layer to electrically connect the plurality of second upper coil patterns and the plurality of second lower coil patterns.

7. The circuit board structure of claim 1, wherein the first inductor on the insulating layer at least partially overlaps the second inductor in an orthogonal projection direction.

8. The circuit board structure of claim 1, wherein a minimum vertical distance from the first inductor to the second inductor is less than or equal to 100 μm.

9. The circuit board structure of claim 1, further comprising a third inductor located on one side of the first inductor and the second inductor and electrically coupled to the first inductor or the second inductor, the third inductor comprising a third conductive coil and a third magnetic flux axis, wherein the third conductive coil in a solenoid form penetrates the insulating layer, and a direction of the third magnetic flux axis is substantially parallel to the first surface.

10. The circuit board structure of claim 9, wherein the third conductive coil comprises:
    a plurality of third upper coil patterns, disposed on the first surface of the insulating layer;
    a plurality of third lower coil patterns, disposed on the second surface of the insulating layer; and
    a plurality of third conductive through holes, penetrating the insulating layer to electrically connect the plurality of third upper coil patterns and the plurality of third lower coil patterns.

11. The circuit board structure of claim 9, wherein the third conductive coil comprises: a plurality of third upper coil patterns is disposed on the first dielectric layer, a plurality of third lower coil patterns is disposed on the second dielectric layer, and a plurality of third conductive though holes penetrates the insulating layer, the first dielectric layer, and the second dielectric layer to electrically connect the plurality of third upper coil patterns and the plurality of third lower coil patterns.

12. The circuit board structure of claim 9, wherein a minimum horizontal distance from the third inductor to the first inductor or the second inductor is less than or equal to 100 μm.

13. The circuit board structure of claim 10, wherein each of the plurality of third conductive through holes comprises a solid conductive post, a hollow conductive through hole, or an X-type conductive through hole.

14. A manufacturing method of a circuit board structure, comprising:

provi ding an insulating layer comprising a first conductive through hole, a first surface, and a second surface opposite to the first surface, the first conductive through hole penetrating the insulating layer to connect the first surface and the second surface;

forming a plurality of first upper coil patterns parallel to one another on the first surface of the insulating layer;

forming a plurality of second upper coil patterns parallel to one another on the second surface of the insulating layer;

forming a first dielectric layer on the plurality of first upper coil patterns;

forming a second dielectric layer on the plurality of second upper coil patterns;

forming a plurality of first conductive blind holes penetrating the first dielectric layer;

forming a plurality of second conductive blind holes penetrating the second dielectric layer;

forming a plurality of first lower coil patterns parallel to one another on the first dielectric layer, wherein the plurality of first lower coil patterns is electrically connected to the plurality of first upper coil patterns via the plurality of first conductive blind holes, and the plurality of first upper coil patterns, the plurality of first conductive blind holes, and the plurality of first lower coil patterns constitute a first inductor; and forming a plurality of second lower coil patterns parallel to one another on the second dielectric layer, wherein the plurality of second lower coil patterns is electrically connected to the plurality of second upper coil patterns via the plurality of second conductive through holes, and the plurality of second upper coil patterns, the plurality of second conductive blind holes, and the plurality of second lower coil patterns constitute a second inductor.

15. The manufacturing method of the circuit board structure of claim 14, wherein an extension direction of the plurality of first upper coil patterns is different from an extension direction of the plurality of first lower coil patterns, and an extension direction of the plurality of second upper coil patterns is different from an extension direction of the plurality of second lower coil patterns.

16. The manufacturing method of the circuit board structure of claim 14, wherein the first inductor on the insulating layer at least partially overlaps the second inductor in an orthogonal projection direction.

17. The manufacturing method of the circuit board structure of claim 14, wherein a minimum vertical distance from the first inductor to the second inductor is less than or equal to 100 μm.

18. The manufacturing method of the circuit board structure of claim 14, further comprising:

forming a plurality of third conductive through holes penetrating the insulating layer; and respectively forming a plurality of third upper coil patterns and a plurality of third lower coil patterns on the first surface and the second surface of the insulating layer, wherein the plurality of third lower coil patterns is electrically connected to the plurality of third upper coil patterns via the plurality of third conductive through holes, and the plurality of third upper coil patterns, the plurality of third conductive through holes, and the plurality of third lower coil patterns constitute a third inductor.

19. The manufacturing method of the circuit board structure of claim 18, wherein a minimum horizontal distance from the third inductor to the first inductor or the second inductor is less than or equal to 100 μm.

20. The manufacturing method of the circuit board structure of claim 14, further comprising:

forming a plurality of third conductive through holes penetrating the insulating layer, the first dielectric layer and the second dielectric layer; and respectively forming a plurality of third upper coil patterns and a plurality of third lower coil patterns on the first dielectric layer and the second dielectric layer, wherein the plurality of third lower coil patterns is electrically connected to the plurality of third upper coil patterns via the plurality of third conductive through holes, and the plurality of third upper coil patterns, the plurality of third conductive through holes, and the plurality of third lower coil patterns constitute a third inductor.

* * * * *